United States Patent
Yamasaki (10) Patent No.: US 10,651,214 B2
(45) Date of Patent: May 12, 2020

(54) IMAGING APPARATUS AND CONTROL METHOD THEREFOR

(71) Applicant: CANON KABUSHIKI KAISHA, Tokyo (JP)

(72) Inventor: Ryo Yamasaki, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 16/100,025

(22) Filed: Aug. 9, 2018

(65) Prior Publication Data

US 2019/0067348 A1 Feb. 28, 2019

(30) Foreign Application Priority Data

Aug. 23, 2017 (JP) ................. 2017-160119

(51) Int. Cl.

| | |
|---|---|
| *H01L 27/146* | (2006.01) |
| *H04N 5/3745* | (2011.01) |
| *H04N 5/374* | (2011.01) |
| *H04N 5/359* | (2011.01) |
| *H04N 5/235* | (2006.01) |
| *H04N 5/232* | (2006.01) |
| *H04N 5/238* | (2006.01) |

(52) U.S. Cl.
CPC .. *H01L 27/14609* (2013.01); *H01L 27/14605* (2013.01); *H04N 5/2353* (2013.01); *H04N 5/359* (2013.01); *H04N 5/3741* (2013.01); *H04N 5/37452* (2013.01); *H04N 5/238* (2013.01); *H04N 5/23245* (2013.01)

(58) Field of Classification Search
CPC ........ H01L 27/14609; H01L 27/14605; H04N 5/2353; H04N 5/359; H04N 5/3741; H04N 5/37452; H04N 5/23245; H04N 5/238

See application file for complete search history.

(56) References Cited

U.S. PATENT DOCUMENTS

| | | | |
|---|---|---|---|
| 2010/0165167 A1 | 7/2010 | Sugiyama | |
| 2013/0214128 A1 | 8/2013 | Yamashita | |
| 2016/0366350 A1* | 12/2016 | Roffet | ............ H04N 5/3597 |
| 2017/0094202 A1* | 3/2017 | Kobayashi | ............ H04N 5/359 |

FOREIGN PATENT DOCUMENTS

| | | |
|---|---|---|
| JP | 2010-157893 A | 7/2010 |
| JP | 2013-172210 A | 9/2013 |

* cited by examiner

*Primary Examiner* — Georgia Y Epps
*Assistant Examiner* — Don J Williams
(74) *Attorney, Agent, or Firm* — Canon U.S.A., Inc. IP Division (57) ABSTRACT

An imaging apparatus includes an imaging unit configured to acquire a first image and a second image which is generated by performing accumulation of signal charges a plurality of times in one image capturing period, and a control unit configured to control accumulation of signal charges which is performed by the imaging unit. The control unit determines a number of times of accumulation of signal charges for generating the second image according to an accumulation time of signal charges for generating the first image.

19 Claims, 11 Drawing Sheets

IMAGING APPARATUS AND CONTROL METHOD THEREFOR

BACKGROUND

Field of the Disclosure

Aspects of the present disclosure generally relate to an imaging apparatus and a control method therefor.

Description of the Related Art

Concurrently performing capturing of a moving image and a still image enables, during playback, not only viewing a captured scene as a moving image, but also enjoying a crucial scene in the moving image as a still image. Generally, if the moving image played back provides a riffling feeling in a sort of frame-by-frame playback manner, the high quality of the moving image would be greatly lost. To prevent the occurrence of such a riffling feeling, it may sometimes be necessary to set an accumulation time close to one frame period in a series of image capturing operations. In other words, if the frame rate is 30 frames per second (fps), a relative long exposure time such as 1/30 seconds or 1/60 seconds is adequate. On the other hand, with regard to a still image, since a sharpness as sharp as a stopped image captured in an instant is desired, to achieve a stop motion effect, it sometimes may be necessary to set a short exposure time, such as about 1/1000 seconds.

Heretofore, proposed imaging apparatuses, each of which concurrently captures both a moving image and a still image as two video images, include an imaging apparatus which is equipped with two image sensors, including an image sensor for moving images and an image sensor for still images, and an imaging apparatus in which an image sensor is provided with different photoelectric conversion portions that are respectively used for moving images and still images.

Japanese Patent Application Laid-Open No. 2010-157893 discusses a technique to vary conditions, such as an exposure time and an exposure amount, at high speed and in a free manner by transferring electric charges obtained by conversion by a photoelectric conversion portion to an accumulation portion a plurality of times and collectively accumulating the electric charges transferred a plurality of times. Therefore, the technique discussed in Japanese Patent Application Laid-Open No. 2010-157893 can be applied to conceiving an imaging apparatus in which each pixel is provided with two signal retention portions respectively used for accumulating electric charges for moving images and still images. Specifically, in one frame period, the imaging apparatus evenly disperses short accumulation periods in one frame period and performs accumulation a plurality of times at the signal retention portion for moving images, thus acquiring a moving image. Then, the imaging apparatus performs accumulation at the signal retention portion for still images with use of a time between the short accumulation periods for moving images, thus acquiring a still image.

SUMMARY

According to an aspect of the disclosure, an imaging apparatus includes an imaging unit configured to acquire a first image and a second image which is generated by performing accumulation of signal charges a plurality of times in one image capturing period, and a control unit configured to control accumulation of signal charges which is performed by the imaging unit. The control unit determines a number of times of accumulation of signal charges for generating the second image according to an accumulation time of signal charges for generating the first image.

Further features of the embodiments in the present disclosure will become apparent from the following description of exemplary embodiments with reference to the attached drawings.

DESCRIPTION OF THE EMBODIMENTS

Figure 1A:
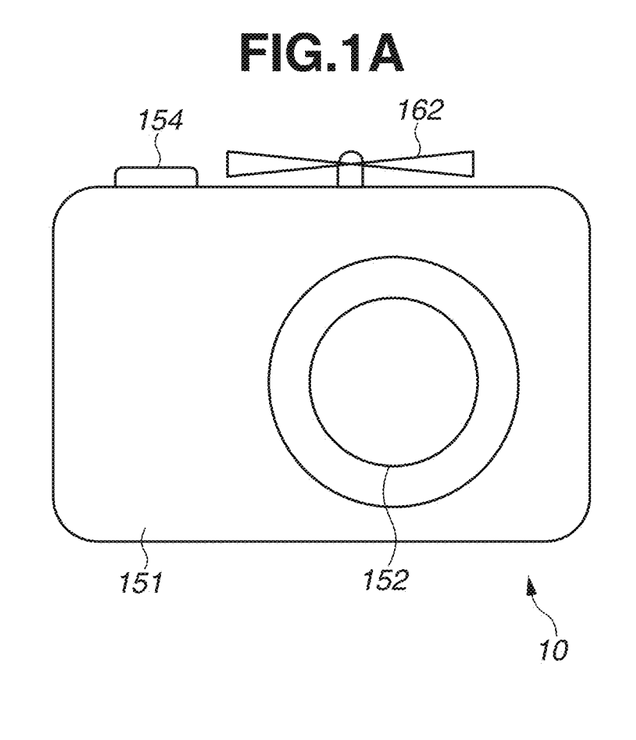
FIGS. 1A and 1B are appearance diagrams of an imaging apparatus.
Figure 1B:
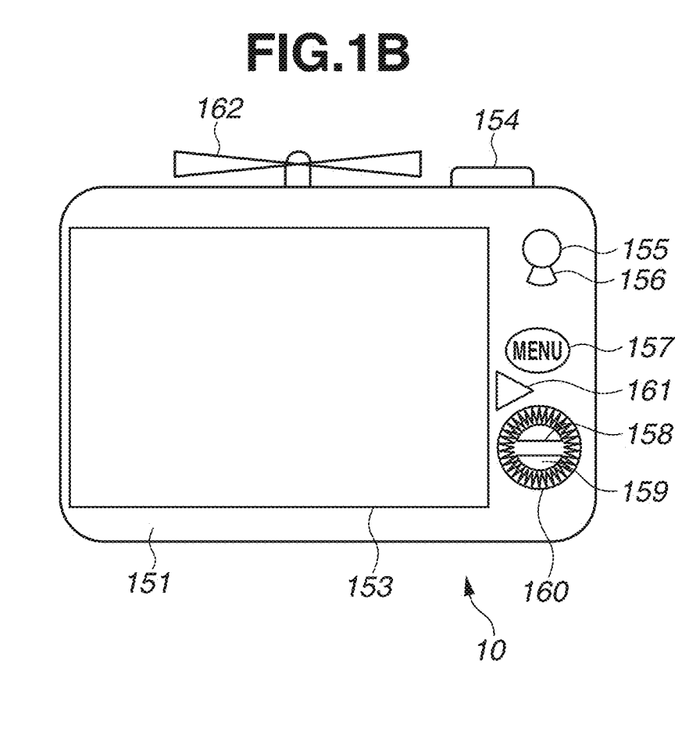

FIGS. 1A and 1B are appearance diagrams of an imaging apparatus 10 according to a first exemplary embodiment. FIG. 1A is a front view of the imaging apparatus 10, and FIG. 1B is a back view of the imaging apparatus 10. The imaging apparatus 10 is, for example, a digital motion camera capable of capturing both a still image and a moving image. While, in the present exemplary embodiment, an imaging apparatus in which a lens is integrated with the body of the imaging apparatus is described as an example, the present exemplary embodiment is not limited to this, but can be, for example, a lens-interchangeable type digital single-lens reflex camera. The imaging apparatus 10 includes an imaging apparatus body 151, an imaging optical system 152, a display unit 153 of the movable type, a switch ST 154, and a propeller 162. Moreover, the imaging apparatus 10 further includes a switch MV 155, a selection lever 156, a menu button 157, an up switch 158, a down switch 159, a dial 160, and a playback button 161.

The imaging apparatus body 151 is a body portion of the imaging apparatus 10 which contains an image sensor and a shutter device therein. The imaging optical system 152 is an imaging optical system which contains a lens and a diaphragm therein. The display unit 153 is a display unit of the movable type for displaying image capturing information and a video image. The display unit 153 has such a display luminance range as to be able to display the luminance range of a wide dynamic range video image without restriction. The switch ST 154 is a shutter button which may be mainly used to capture a still image. The propeller 162 is a propeller which is used to cause the imaging apparatus 10 to float in the air to perform image capturing from the air.

The switch MV 155 is a button which is used to start and stop moving image capturing. The selection lever 156 is an image capturing mode selection lever which is used to select one of image capturing modes. The menu button 157 is a menu button which is used to transition to a function setting mode for performing function settings of the imaging apparatus 10. The up switch 158 and the down switch 159 configure an up-and-down switch which is used to change various setting values. The dial 160 is a dial which is used to change various setting values. The playback button 161 is a button which is used for transition to a playback mode for playing back, on the display unit 153, a video image recorded on a recording medium loaded in the imaging apparatus 10.

Figure 2:
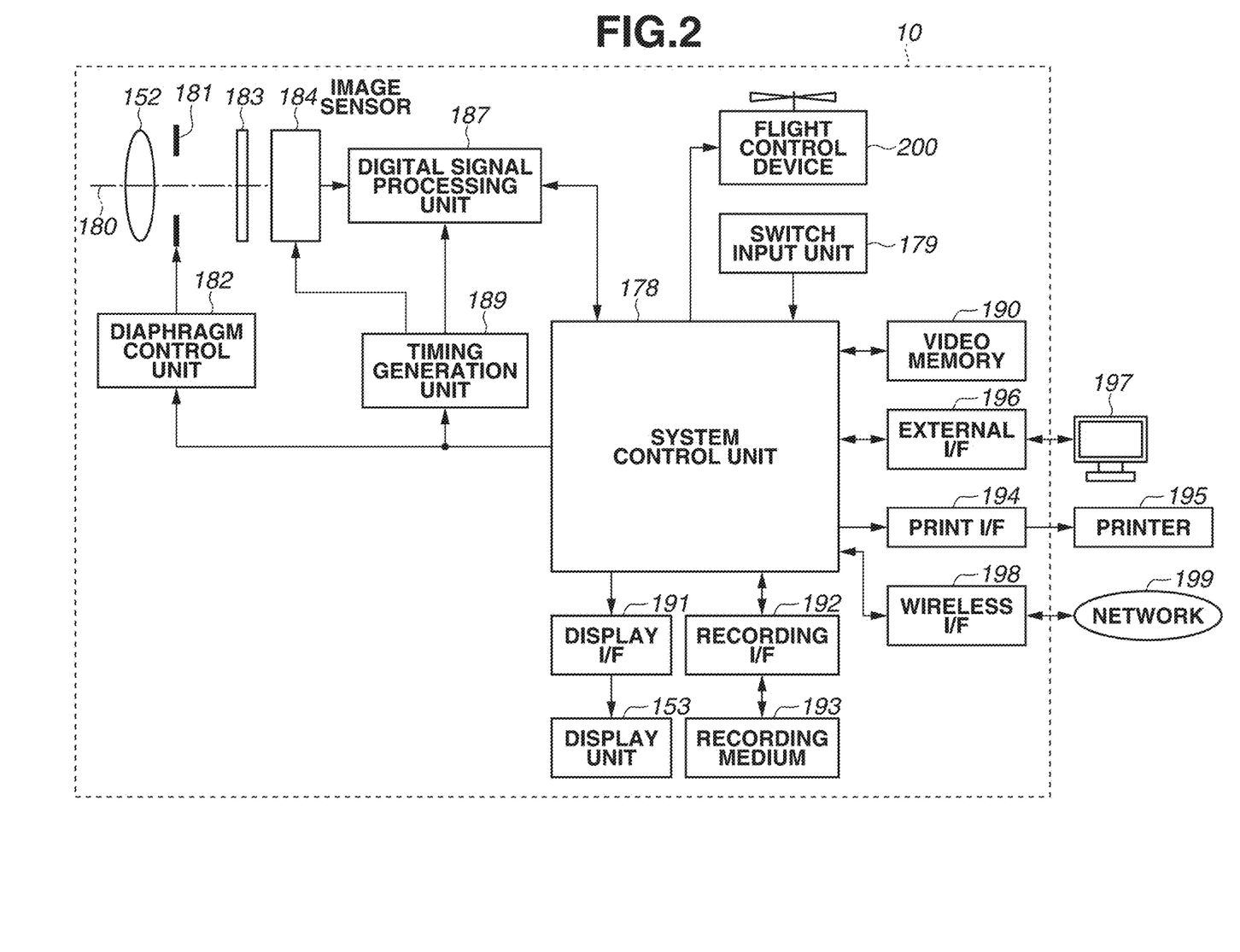
FIG. 2 is a block diagram illustrating a schematic configuration of the imaging apparatus.

FIG. 2 is a block diagram illustrating a schematic configuration of the imaging apparatus 10. The imaging apparatus 10 includes the imaging optical system 152, a diaphragm 181, a diaphragm control unit 182, an optical filter 183, an image sensor 184, a digital signal processing unit 187, a timing generation unit 189, and a system control unit 178. Moreover, the imaging apparatus 10 further includes a display interface (I/F) 191, the display unit 153, a recording I/F 192, a recording medium 193, a wireless IT 198, a print I/F 194, and an external I/F 196. Additionally, the imaging apparatus 10 further includes a video memory 190, a switch input unit 179, and a flight control device 200.

The imaging optical system 152 focuses an optical image of a subject on the image sensor 184. The imaging optical system 152 has an optical axis 180. The diaphragm 181 is a diaphragm which adjusts the amount of light passing through the imaging optical system 152, and is controlled by the diaphragm control unit 182. The optical filter 183 limits the wavelengths of light incident on the image sensor 184 and the spatial frequencies of light transmitted to the image sensor 184. The image sensor 184 converts the optical image of a subject focused by the imaging optical system 152 into an electrical video signal. The image sensor 184 has such a number of pixels, signal readout speed, color gamut, and dynamic range as to sufficiently satisfy the standard of Ultra High Definition Television.

The digital signal processing unit 187 performs various corrections on digital video data output from the image sensor 184, and then compresses the video data. The timing generation unit 189 outputs various timing signals to the image sensor 184 and the digital signal processing unit 187, thus controlling various timing operations. The system control unit 178 is a central processing unit (CPU) which performs various arithmetic operations and controls the entire imaging apparatus 10. Thus, the timing generation unit 189 and the system control unit 178 have the function of a control unit to control timing of transfer, accumulation, and readout of signal charges in the image sensor 184.

The display I/F 191 is an interface used to display a captured video image on the display unit 153. The display unit 153 may be, for example, a liquid crystal display. The recording I/F 192 is an interface used to perform recording and readout on and from the recording medium 193. The recording medium 193 is a removable recording medium, such as a memory, on which to record, for example, video data and appended data. The wireless I/F 198 is an interface used to perform communication with an external network 199. The network 199 is a computer network, such as the Internet. The print I/F 194 is an interface used to output a captured video image to an external printer 195 for printing. The printer 195 is, for example, a small-sized inkjet printer. The external I/F 196 is an interface used to perform communication with, for example, an external apparatus 197. The external apparatus 197 is an apparatus capable of displaying an image, such as a computer or a television set.

The video memory 190 temporarily stores video data. The switch input unit 179 includes the switch ST 154, the switch MV 155, and a plurality of switches for switching various modes. Moreover, the switch input unit 179 also has the function of a light amount instruction unit which issues an instruction for the setting of the number of steps of neutral density (ND) serving as a light amount restricted amount. The flight control device 200 is a flight control device used to perform image capturing from the air.

Figure 3:
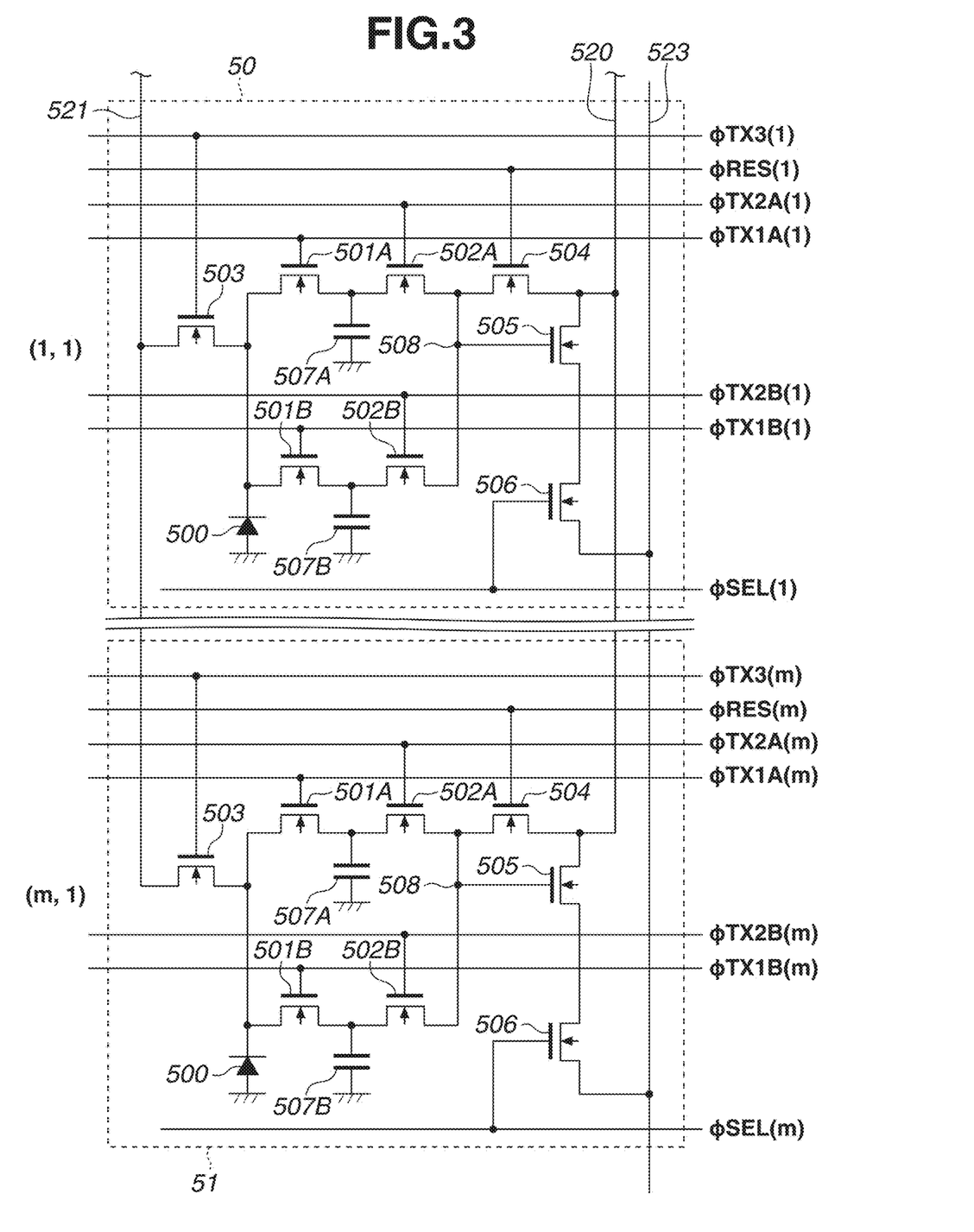
FIG. 3 is a circuit diagram of a part of an image sensor.

FIG. 3 is a circuit diagram illustrating a configuration of pixels of the image sensor 184. The image sensor 184 includes a great number of pixel elements (pixel portions) arrayed in a two-dimensional manner. In FIG. 3, among the great number of pixel elements of the image sensor 184, a pixel element 50 in the first row and the first column (1, 1) and a pixel element 51 in the m-th row, which is the final row, and the first column (m, 1) are illustrated. Since the configurations of the pixel element 50 and the pixel element 51 are the same, the constituent elements of the respective pixels are assigned the respective same reference characters.

Each pixel element of the image sensor 184 includes two signal retention portions 507A and 507B with respect to one photodiode 500. Including the first signal retention portion 507A and the second signal retention portion 507B with respect to one photodiode 500 enables almost concurrently capturing a still image serving as a first image and a moving image serving as a second image. In the present exemplary embodiment, the signal retention portion 507A accumulates electric charges for a still image and the signal retention portion 507B accumulates electric charges for a moving image. Therefore, two images different in accumulation period can be read out without a decrease in signal-to-noise (S/N) ratio. The basic structure of the image sensor 184 including signal retention portions is discussed in Japanese Patent Application Laid-Open No. 2013-172210 and in U.S. Publication No. 2013/0214128, which are incorporated by reference herein and which are assigned to the same assignee as that of the present application. Furthermore, while, in the present exemplary embodiment, an example in which two signal retention portions are included is described, the present exemplary embodiment is not limited to this, but a plurality of signal retention portions can be included.

The pixel element 50 includes a photodiode 500, which is a photoelectric conversion portion, the first signal retention portion 507A, and the second signal retention portion 507B. Moreover, the pixel element 50 further includes a first transfer transistor 501A, a second transfer transistor 502A, a third transfer transistor 501B, a fourth transfer transistor 502B, and a fifth transfer transistor 503. Moreover, the pixel element 50 further includes a reset transistor 504, an amplification transistor 505, a selection transistor 506, and a floating diffusion area 508. Furthermore, the pixel element 50 further includes a power supply line 520, a power supply line 521, and a signal output line 523.

The first transfer transistor 501A is controlled by a transfer pulse signal ϕTX1A. The second transfer transistor 502A is controlled by a transfer pulse signal ϕTX2A. The third transfer transistor 501B is controlled by a transfer pulse signal ϕTX1B. The fourth transfer transistor 502B is controlled by a transfer pulse signal ϕTX2B. The fifth transfer transistor 503 is controlled by a transfer pulse signal ϕTX3. The reset transistor 504 is controlled by a reset pulse signal ϕRES. The selection transistor 506 is controlled by a selection pulse signal ϕSEL. Here, the above control pulse signals are sent out from a vertical scanning circuit (not illustrated).

The start timing of accumulation is determined by bringing the photodiode 500 into a reset state with use of the transfer pulse signal ϕTX3, which is used to control the fifth transfer transistor 503. Moreover, the timing at which electric charges accumulated in the photodiode 500 are transferred to the first signal retention portion 507A is determined by the transfer pulse signal ϕTX1A, which is used to control the first transfer transistor 501A. The timing at which electric charges accumulated in the photodiode 500 are transferred to the second signal retention portion 507B is determined by the transfer pulse signal ϕTX1B, which is used to control the third transfer transistor 501B. Here, the above control pulse signals are sent out from the vertical scanning circuit (not illustrated).

Figure 4:
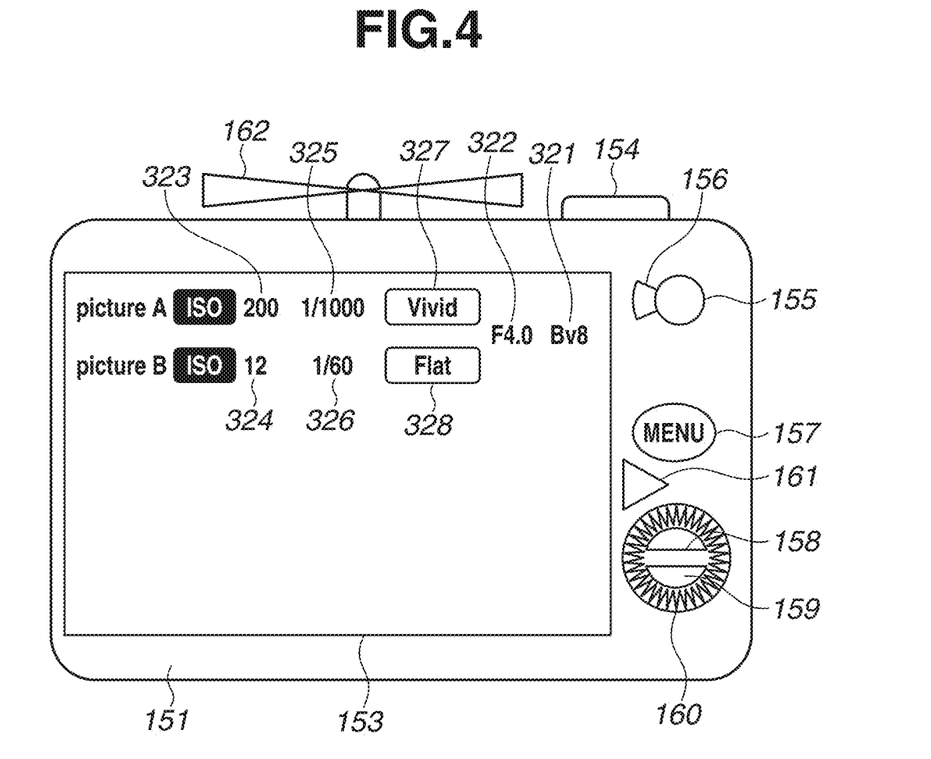
FIG. 4 is a diagram illustrating a setting screen for image capturing conditions for a still image and a moving image.

FIG. 4 is a diagram used to describe a setting screen for image capturing conditions of a still image (picture A) and a moving image (picture B) in the imaging apparatus body 151. A dual video mode, which is a mode of concurrently capturing a still image and a moving image, is selected by rotating the selection lever 156 clockwise. A Bv value 321 and an F-number 322 corresponding to the luminance of a subject are displayed on the display unit 153. Moreover, the ISO sensitivity 323, shutter speed 325, and picture mode 327 of the still image (picture A) and the ISO sensitivity 324, shutter speed 326, and picture mode 328 of the moving image (picture B) are displayed on the display unit 153. The picture modes 327 and 328 adapted for the purpose of image capturing can be selected from a plurality of options via the up switch 158, the down switch 159, and the dial 160.

Figure 5:
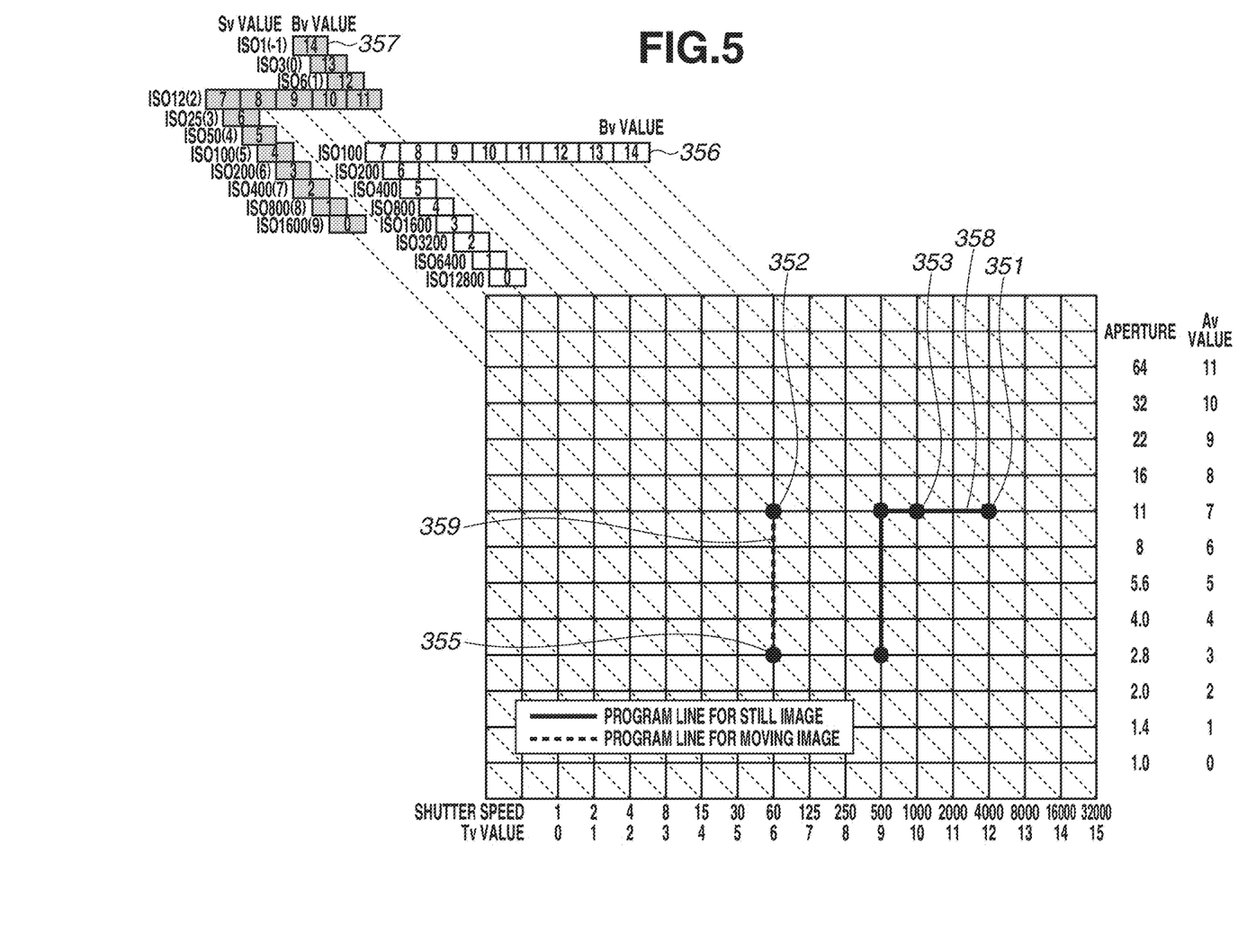
FIG. 5 is a program automatic exposure (AE) chart in a dual video mode.

FIG. 5 is a diagram illustrating an example of a program automatic exposure (AE) chart in the dual video mode. The horizontal axis indicates a Tv value and a shutter speed corresponding to the Tv value, the vertical axis indicates an Av value and an aperture value corresponding to the Av value, and the diagonal indicates a Bv value. A program line 358 denoted by a solid line is a program line for a still image. On the other hand, a program line 359 denoted by a dashed line is a program line for a moving image. A rectangle 356 with a white background located at the upper left side is a gain indication region representing a relationship between the Bv value and the ISO sensitivity of a still image. On the other hand, a rectangle 357 with a black background is a gain indication region representing a relationship between the Bv value and the ISO sensitivity of a moving image. A number in parentheses indicated next to the ISO sensitivity represents an SAT value.

In the present exemplary embodiment, the shutter speed for still images is set in the range of $1/500$ to $1/4000$, and the shutter speed equivalent to a frame rate for moving images is set to $1/60$. Moreover, since a still image serving a first image signal and a moving image serving a second image signal are concurrently captured via a single image capturing lens, the program AE chart is set in such a manner that the same aperture value is employed with respect to the same subject luminance.

Here, while, in the present exemplary embodiment, the lower limit of the shutter speed is set to $1/500$, this is because exclusive accumulation control is performed on a still image and a moving image. A detailed reason thereof is described below. Furthermore, exposure control such as that described above in the image sensor 184 is performed based on a program chart in the dual video mode, which is a mode capable of concurrently capturing two video images, a still image and a moving image, described with reference to FIG. 4. In the other image capturing modes, this is not applied.

In the program chart illustrated in FIG. 5, with regard to a moving image, accumulation control is implemented by changing the ISO sensitivity. For example, a subject with a Bv value of 12 for a still image is taken as an example for description. When the Bv value is 12 for a still image, the ISO sensitivity of the still image is set to ISO100. The Bv line of the still image in the case of the Bv value of 12 intersects with the program line 358 for a still image at a point 353 thereon. The shutter speed of $1/1000$ and the F-number of 11.0 are determined based on the point 353. On the other hand, with regard to a moving image, since the shutter speed is intended to be set to $1/60$, when the F-number is 11.0, a point 352 is determined on the program line. Since the point 353 and the point 352 differ by four steps in Tv value, the ISO sensitivity for the moving image is reduced by four steps to ISO6, so that accumulation control for appropriate exposure can be attained.

Performing exposure control according to the program chart illustrated in FIG. 5 enables a still image to keep a shutter speed of $1/500$ or more in the specified overall luminance range and enables a moving image to keep a shutter speed of $1/60$ in the overall luminance range. Therefore, while, with regard to a still image, a stop motion effect is attained, with regard to a moving image, a high-quality moving image without a riffling feeling in a frame-by-frame playback manner can be acquired.

However, the control range of the ISO sensitivity is finite, so that, for example, the lower limit of the ISO sensitivity may be ISO100 in some cases. When both a still image and a moving image are concurrently captured with the same aperture value, even if the ISO sensitivity is controlled by performing exposure control in such a manner that the still image has a correct exposure with respect to a high-luminance subject, the moving image may be saturated. Therefore, control is performed to generate a moving image by, in the period of the shutter speed of $1/60$ for the moving image, transferring short accumulations dispersed at almost equal intervals a number of times of transfer Np (Np>1) to the second signal retention portion 507B and adding together the short accumulations, so that the moving image has substantially the same amount of accumulation as that of the still image. Here, the number of times of transfer Np indicates the number of times to transfer signal charges generated by the photodiode 500, which is a photoelectric conversion portion, to the second signal retention portion 507B, in other words, the number of times of accumulation of signal charges in the second signal retention portion 507B.

For example, considering the accumulation for a still image with the shutter speed of $1/1000$ and the aperture value of F11.0, in the case of a moving image, to accumulate light having passed through the same optical system, the aperture value becomes F-number 11.0 similarly to the still image. At this time, if Np=8 is set, the moving image is generated by performing control to transfer and add together accumulations uniformly dispersed to eight times in the period of the shutter speed of $1/60$. With this, the accumulation time for one accumulation to generate a moving image is set to $1/8000$. Then, when the accumulation for $1/8000$ is transferred eight times and the transferred accumulations are added together, the total of the amounts of accumulation becomes equal to the amount of accumulation for the still image for $1/1000$. Accordingly, the still image and the moving image can be caused to have the same amount of accumulation, so that a still image and a moving image both of which have an appropriate exposure can be acquired.

Accumulation control of the image sensor 184 is exclusive accumulation control in the case of the dual video mode, so that a moving image and a still image are not accumulated at the same time. More specifically, if a moving image is obtained by transferring the accumulation for 1/8000 eight times in one period and adding together the transferred accumulations, the accumulation for a still image is provided between the discrete accumulations for a moving image to be performed eight times. Accordingly, if the shutter speed for a still image is set to a long time to some degree or more, the discrete accumulations for a moving image to be performed eight times are not able to be performed. Therefore, in the present exemplary embodiment, the number of times of transfer Np for accumulation and addition for a moving image is changed in conformity with the accumulation time for a still image, so that concurrent acquisition of a still image and a moving image can be attained. Hereinafter, details thereof are described with reference to FIG. 6 to FIG. 8.

Figure 6:
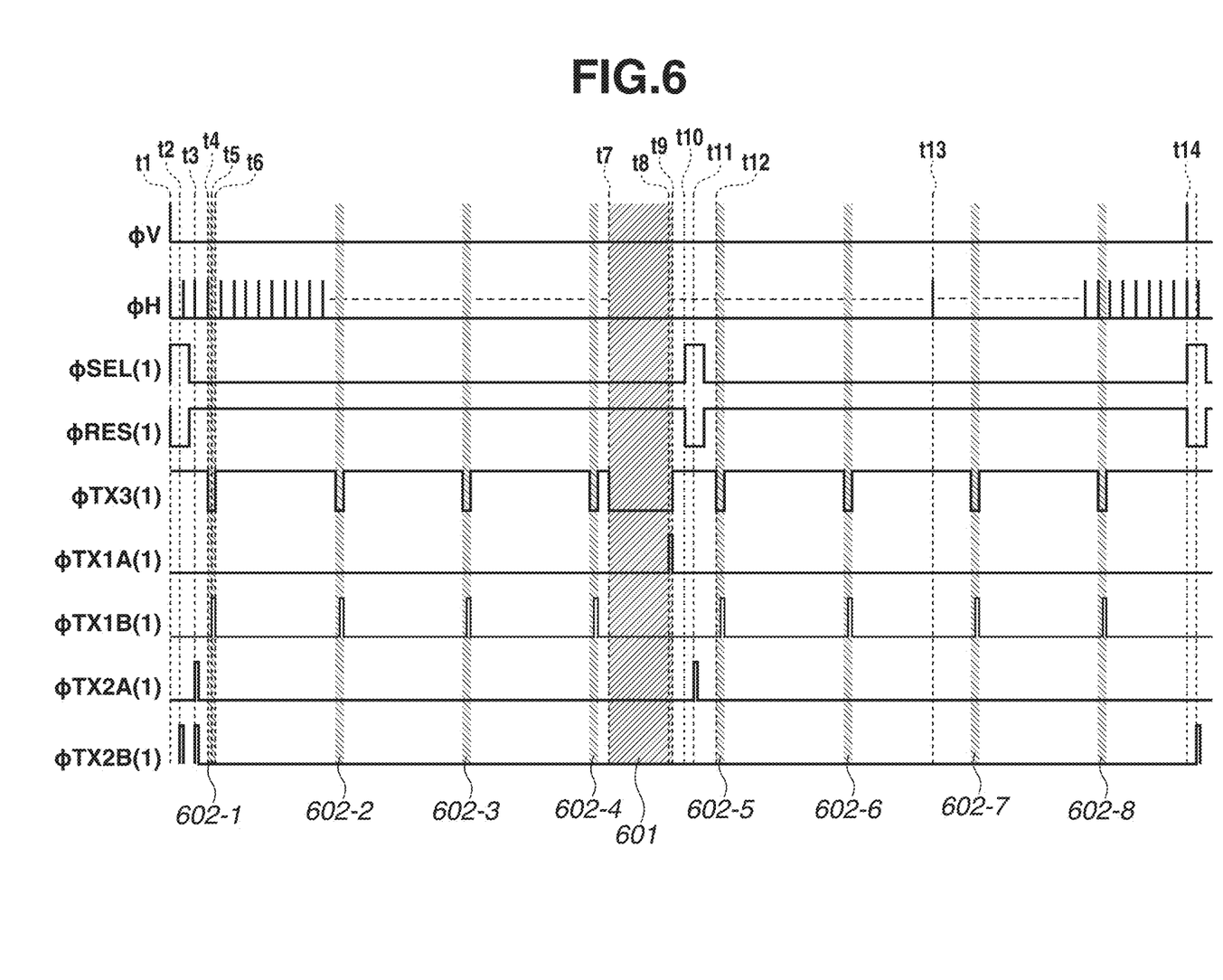
FIG. 6 is a timing chart illustrating a driving sequence of the image sensor.
Figure 7:
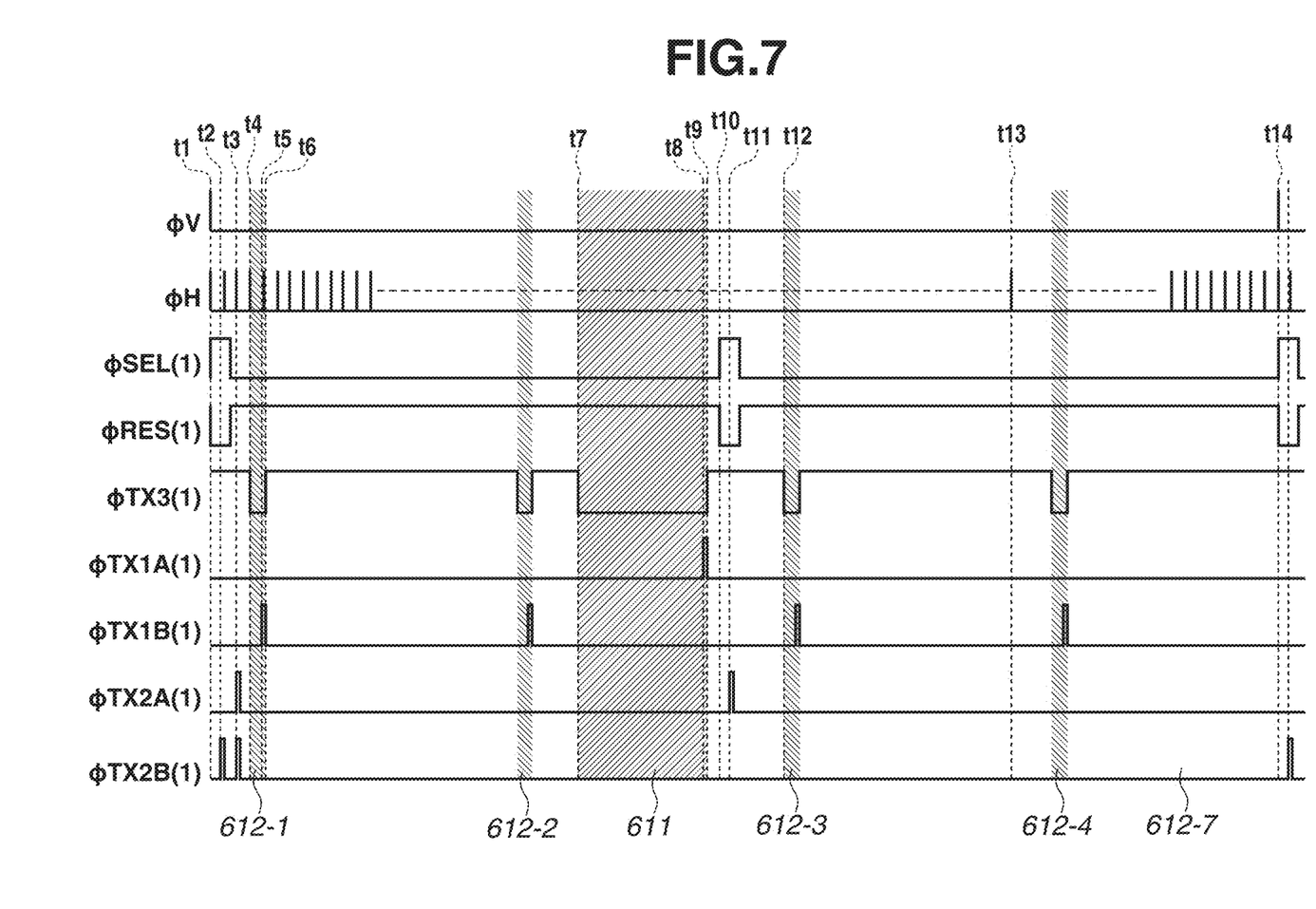
FIG. 7 is a timing chart illustrating a driving sequence of the image sensor.
Figure 8:
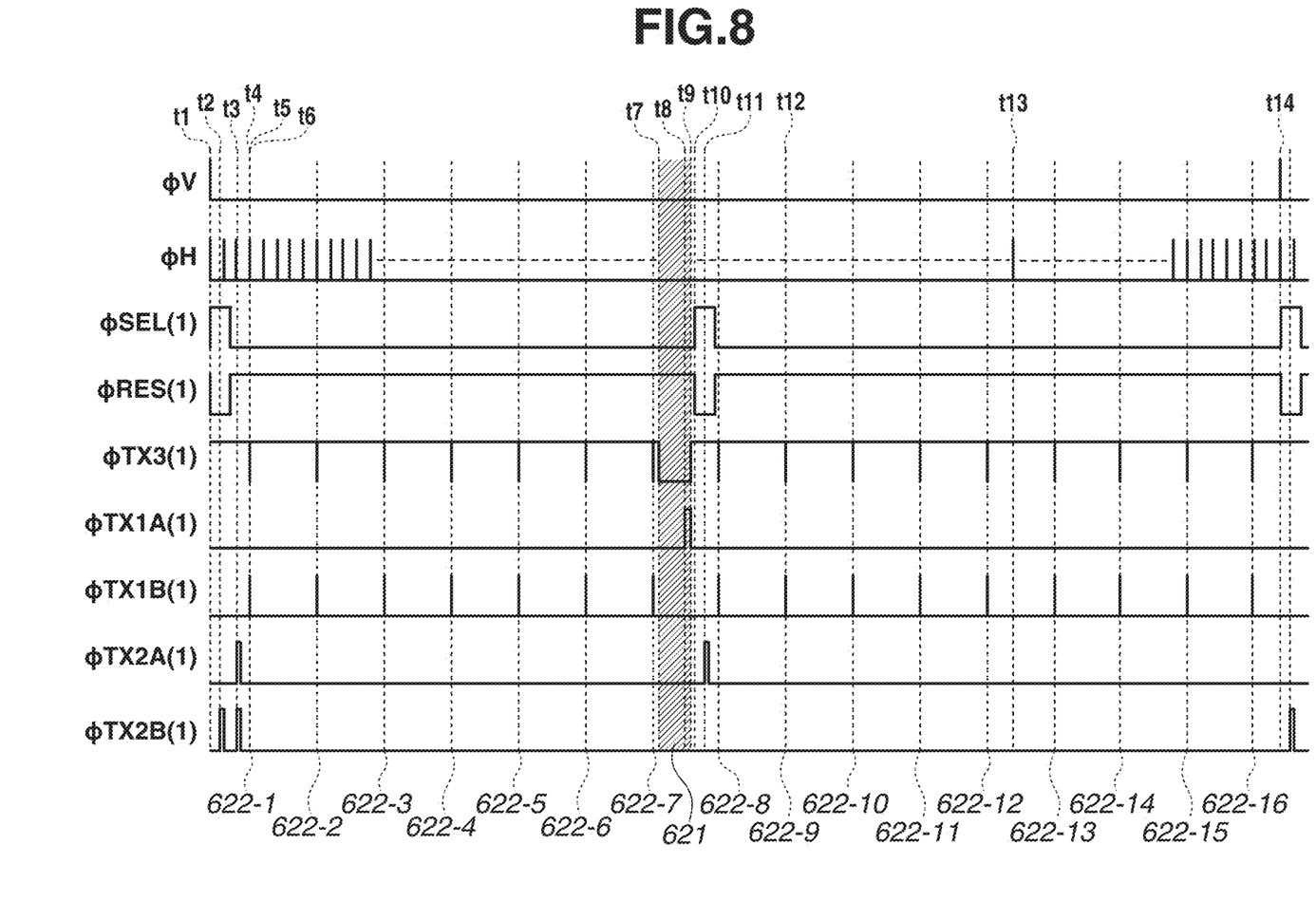
FIG. 8 is a timing chart illustrating a driving sequence of the image sensor.

FIG. 6 to FIG. 8 are timing charts illustrating driving sequences of the image sensor 184. The image sensor 184 in the present exemplary embodiment includes a pixel array having a great number of rows arrayed in the vertical direction, and, in FIG. 6 to FIG. 8, timing in the first row is illustrated. Then, control operations illustrated in FIG. 6 to FIG. 8 are performed in such a way as to perform scanning in the vertical direction according to a horizontal synchronization signal, so that the accumulation operation for all of the pixels of the image sensor 184 is performed. In FIG. 6 to FIG. 8, each of rising times t1 and t14 of a vertical synchronization signal φV corresponds to the start of an image capturing period, and a period from the time t1 to the time t14 corresponds to one image capturing period.

In FIG. 6, the shutter speed (accumulation time) for a still image serving as a first image signal is 1/1000 and the By value is 12. Then, the number of times of transfer Np for a moving image serving as a second image signal is assumed to be 8. Thus, in this case, during one image capturing period (1/60) for a moving image, electric charges generated by exposure with the shutter speed (accumulation time) of 1/8000 are transferred eight times and the transferred electric charges are added together to obtain a second image signal.

First, at time t1, the vertical synchronization signal φV becomes high in level at the timing generation unit 189, and, at the same time, a horizontal synchronization signal φH also becomes high in level. In synchronization with the time ti at which the vertical synchronization signal φV and the horizontal synchronization signal φH become high in level, a reset pulse signal φRES(1) for the first row becomes low in level. When the reset pulse signal φRES(1) becomes low in level, the reset transistor 504 for the first row is turned off, so that the reset state of the floating diffusion area 508 is canceled. At the same time, when a selection pulse signal φSEL(1) for the first row becomes high in level, the selection transistor 506 for the first row is turned on, so that readout of an image signal for the first row becomes enabled.

At time t2, when a transfer pulse signal φTX2B(1) for the first row becomes high in level, the fourth transfer transistor 502B for the first row is turned on. When the fourth transfer transistor 502B is turned on, signal charges of a moving image accumulated and added at the second signal retention portion 507B during the last image capturing period are transferred to the floating diffusion area 508. Moreover, an output corresponding to a change in potential of the floating diffusion area 508 is read out to the signal output line 523 via the amplification transistor 505 and the selection transistor 506. Then, the output read out to the signal output line 523 is supplied to a readout circuit (not illustrated) and is then output as a second image signal (moving image) for the first row to the outside. Furthermore, the second image signal (moving image) to be output here is an image signal accumulated during one image capturing period of the preceding frame.

At time t3, when a transfer pulse signal φTX2A(1) and a transfer pulse signal φTX2B(1) for the first row become high in level, the second transfer transistor 502A and the fourth transfer transistor 502B for the first row are turned on. At this time, the reset pulse signal φRES(1) for all of the rows has already become high in level, and the reset transistor 504 is in an on-state. Therefore, the floating diffusion area 508, the first signal retention portion 507A, and the second signal retention portion 507B for the first row are reset. Furthermore, at time t3, the selection pulse signal φSEL(1) for the first row has already become low in level.

Next, starting with time t4, accumulation of a moving image serving as a second image signal is performed. At time t4, when a transfer pulse signal φTX3(1) for the first row becomes low in level, the fifth transfer transistor 503 is turned off. When the fifth transfer transistor 503 is turned off, resetting of the photodiode 500 for the first row is canceled, so that accumulation of signal charges for a moving image at the photodiode 500 is started.

At time t5, when the transfer pulse signal φTX1B(1) for the first row becomes high in level, the third transfer transistor 501B is turned on. When the third transfer transistor 501B is turned on, signal charges accumulated at the photodiode 500 are transferred to the second signal retention portion 507B, which retains electric charges of a moving image for the first row.

At time t6, when the transfer pulse signal φTX1B(1) for the first row becomes low in level, the third transfer transistor 501E is turned off. When the third transfer transistor 501B is turned off, transfer of signal charges accumulated at the photodiode 500 to the second signal retention portion 507B ends.

Here, a period from time t4 to time t6 corresponds to a second accumulation time 602-1 indicated by a region of diagonal lines from the top-left corner to the bottom-right corner. The second accumulation time 602-1 is an accumulation time (1/8000) of accumulation performed one time for a moving image. An accumulation operation similar to that in the second accumulation time 602-1 is discretely performed eight times (the second accumulation times 602-1 to 602-8) during one image capturing period. Then, accumulations for eight times are successively transferred and added together, so that the accumulation time equivalent to that for a still image (1/8000×8=1/1000) is obtained.

Next, starting with time t7, accumulation for a still image serving as a first image signal is performed. At time t7, when the transfer pulse signal φTX3(1) for the first row becomes low in level, the fifth transfer transistor 503 for the first row is turned off. When the fifth transfer transistor 503 is turned off, resetting of the photodiode 500 is canceled, so that accumulation of signal charges for a still image is started.

At time t8, when the transfer pulse signal φTX1A(1) for the first row becomes high in level, the first transfer transistor 501A for the first row is turned on. When the first transfer transistor 501A is turned on, signal charges accumulated at the photodiode 500 are transferred to the first signal retention portion 507A, which retains electric charges for a still image.

At time t9, when the transfer pulse signal φTX1A(1) for the first row becomes low in level, the first transfer transistor 501A is turned off. When the first transfer transistor 501A is turned off, transfer of signal charges accumulated at the photodiode 500 to the first signal retention portion 507A ends.

Here, a period from time t7 to time t9 corresponds to a first accumulation time 601 indicated by a region of diagonal lines from the top-right corner to the bottom-left corner. The first accumulation time 601 is an accumulation time for a still image (1/1000). Furthermore, in the present exemplary embodiment, the number of times of accumulation for a still image during one image capturing period is one, but can be a plural number, and accumulation of signal charges for generating a still image only needs to be performed one or more times during one image capturing period. Accumulation of signal charges for a still image is performed between accumulations of signal charges for a moving image. In the example illustrated in FIG. 6, the first accumulation time 601 is present between the second accumulation times 602-4 and 602-5.

At time t10, when the reset pulse signal φRES(1) for the first row becomes low in level, the reset transistor 504 for the first row is turned off. When the reset transistor 504 for the first row is turned off, a reset state of the floating diffusion area 508 is canceled. At the same time, when the selection pulse signal φSEL(1) for the first row becomes high in level, the selection transistor 506 for the first row is turned on. When the selection transistor 506 is turned on, readout of an image signal for the first row becomes enabled.

At time t11, when the transfer pulse signal φTX2A(1) for the first row becomes high in level, the second transfer transistor 502A for the first row is turned on. When the second transfer transistor 502A is turned on, signal charges of a still image accumulated in the first signal retention portion 507A for the first row are transferred to the floating diffusion area 508. Moreover, an output corresponding to a change in potential of the floating diffusion area 508 is read out to the signal output line 523 via the amplification transistor 505 and the selection transistor 506 for the first row. Then, the output read out to the signal output line 523 is supplied to a readout circuit (not illustrated) and is then output as a first image signal (still image) for the first row to the outside.

At time t12, accumulation for the fifth time for a moving image is started. Next, at time t14, the vertical synchronization signal φV becomes high in level at the timing generation unit 189, and, at the same time, the horizontal synchronization signal φH also becomes high in level, so that a next image capturing period is started. Then, an image signal obtained by addition at the second accumulation times 602-1 to 602-8 in a period from time t1 to time t14 is output as a second image signal (moving image) to the outside at time t14 or later.

Furthermore, a timing chart for the second row is performed in synchronization with the horizontal synchronization signal φH immediately after time t1. Thus, timing charts for all of the rows are started during a period from time t1 to time t14. For example, a timing chart which is started by the horizontal synchronization signal φH at time t13 is assumed to be that for the m-th row. Switch signals for the m-th row can be expressed as φSEL(m), φRES(m), φTX3(m), φTX1A(m), φTX1B(m), φTX2A(m), and φTX2B(m).

In the present exemplary embodiment, a configuration in which the first image signal (still image) is read out near the middle of one image capturing period and the second image signal (moving image) is read out at the initial stage of one image capturing period is employed. In other words, readout of the first image signal (still image) and readout of the second image signal (moving image) are provided at almost equal intervals in each image capturing period. This is for the purpose of avoiding overlap of readout of the first image signal (still image) and readout of the second image signal (moving image) in a case where readout from a great number of rows is performed according to the horizontal synchronization signal φH. Moreover, it is desirable that readout of the first image signal (still image) be performed near the middle and in the first half of one image capturing period. This is for the purpose of avoiding overlap of readout due to a rolling shutter.

According to the timing chart as described above, a moving image having an amount of exposure equivalent to that of a still image, the first accumulation time of which is 1/1000 can be acquired by setting the second accumulation time to 1/8000 and performing transfer and addition with the number of times of transfer Np set to 8. At this time, with regard to a still image, since the shutter speed (accumulation time) of 1/1000 is implemented, a high-quality image with a high stop motion effect can be obtained. Moreover, with regard to a moving image, since a configuration in which one image signal is obtained by adding together accumulations acquired at short accumulation times set at approximately equal intervals in the period of 1/60 is employed, a high-quality image without a riffling feeling in a frame-by-frame playback manner can be obtained.

In FIG. 7, the shutter speed (accumulation time) for a still image serving as a first image signal is 1/500 and the By value is any one of 0 to 11. Then, the number of times of transfer Np for a moving image serving as a second image signal is assumed to be 4 in this exemplary embodiment. Thus, in this case, during one image capturing period (1/60) for a moving image, electric charges generated by exposure with the shutter speed (accumulation time) of 1/2000 are transferred four times, and the transferred electric charges are added together to obtain a second image signal.

A basic timing chart in FIG. 7 is the same as that in FIG. 6. The shutter speed (accumulation time) for a still image serving as a first image signal is set to 1/500, and is illustrated as a first accumulation time 611 indicated by a region of diagonal lines from the top-right corner to the bottom-left corner. On the other hand, the shutter speed (accumulation time) for a moving image serving as a second image signal is set to 1/2000 because addition with the number of times of transfer Np set to 4 is assumed, and is illustrated as each of second accumulation times 612-1 to 612-4 each indicated by a region of diagonal lines from the top-left corner to the bottom-right corner.

Here, in the example illustrated in FIG. 7, the number of times of transfer Np for a second image signal is set to 4. This is for the purpose of reducing the number of times of transfer Np and widening each interval between the second accumulation times 612-1 to 612-4 because the first accumulation time 611 is 1/500 and has a certain degree of width with respect to one image capturing period of 1/60. However, if the number of times of transfer Np is small, a riffling feeling in a frame-by-frame playback manner would occur with regard to a subject moving at high speed. Therefore, in the present exemplary embodiment, in a case where image capturing is performed in the dual video mode, the shutter speed of 1/500 for a still image serving as a first accumulation time is set as the lower limit at the low-speed side, and the number of times of transfer Np associated with that shutter speed is also set to Np=4 as the lower limit. Therefore, with regard to the program line 358 for a still image illustrated in FIG. 5, the shutter speed of 1/500 is also set as the lower limit at the low-speed side.

In FIG. 8, the shutter speed (accumulation time) for a still image serving as a first image signal is 1/2000 and the By value is 14. Then, the number of times of transfer Np for a moving image serving as a second image signal is assumed to be 16. Thus, in this case, during one image capturing period ($1/60$) for a moving image, electric charges generated by exposure with the shutter speed (accumulation time) of $1/32000$ are transferred sixteen times and the transferred electric charges are added together to obtain a second image signal.

A basic timing chart in FIG. 8 is the same as that in FIG. 6. The shutter speed (accumulation time) for a still image serving as a first image signal is set to $1/2000$, and is illustrated as a first accumulation time 621 indicated by a region of diagonal lines from the top-right corner to the bottom-left corner. On the other hand, the shutter speed (accumulation time) for a moving image serving as a second image signal is set to $1/32000$ because addition with the number of times of transfer Np set to 16 is assumed in this exemplary embodiment, and is illustrated as each of second accumulation times 622-1 to 622-16 each indicated by a region of diagonal lines from the top-left corner to the bottom-right corner.

Here, in the example illustrated in FIG. 8, the number of times of transfer Np for a second image signal is set to 16. This is because, since the first accumulation time 621 is $1/2000$ and is a very short time with respect to one image capturing period of $1/60$, it is possible to set the first accumulation time 621 even if the number of times of transfer Np is increased. However, if the number of times of transfer Np is large, an accumulation operation and a transfer processing operation for a second image signal are increased, so that a processing load would increase. Therefore, in the present exemplary embodiment, in a case where image capturing is performed in the dual video mode, the number of times of transfer Np is set to Np=16 as the upper limit. Furthermore, with regard to the program line 358 for a still image illustrated in FIG. 5, the shutter speed of $1/4000$ for a still image serving as a first image signal is set as the upper limit at the high-speed side. Even when the shutter speed for a still image is set to the high-speed side, the width of only the first accumulation time 621 becomes small, so that an exclusive positional relationship with the second accumulation times 622-1 to 622-16 does not break up. Therefore, in the present exemplary embodiment, the upper limit of the shutter speed for a still image is determined based on a limit speed of the shutter. Furthermore, in the present exemplary embodiment, the upper limit of the number of times of transfer Np is set to 16, but can be increased to 32 or 64 if the processing speed is improved. This further enables obtaining a second image without a refilling speed in a frame-by-frame playback manner even with respect to a high-speed moving subject.

As described with reference to FIG. 6 to FIG. 8, in the present exemplary embodiment, the number of times of transfer (the number of times of addition) of signal charges for a moving image during one image capturing period to the second signal retention portion 507B is determined based on the shutter speed (accumulation time) for a still image. The number of times of transfer for a moving image in a case where the shutter speed for a still image is $1/500$ is 4 serving as the lower limit, the number of times of transfer for a moving image in a case where the shutter speed for a still image is $1/1000$ is 8, and the number of times of transfer for a moving image in a case where the shutter speed for a still image is $1/2000$ is 16 serving as the upper limit. In this way, within a range between the lower limit and the upper limit, the number of times of transfer is smaller as the shutter speed for a still image is lower, and is larger as the shutter speed for a still image is higher. In this way, the number of times of transfer for a moving image is set according to the accumulation time for a still image, so that acquiring a still image and a moving image with a high-quality video image in a wide variety of exposure conditions such as the luminance of a subject is enabled.

Figure 9:
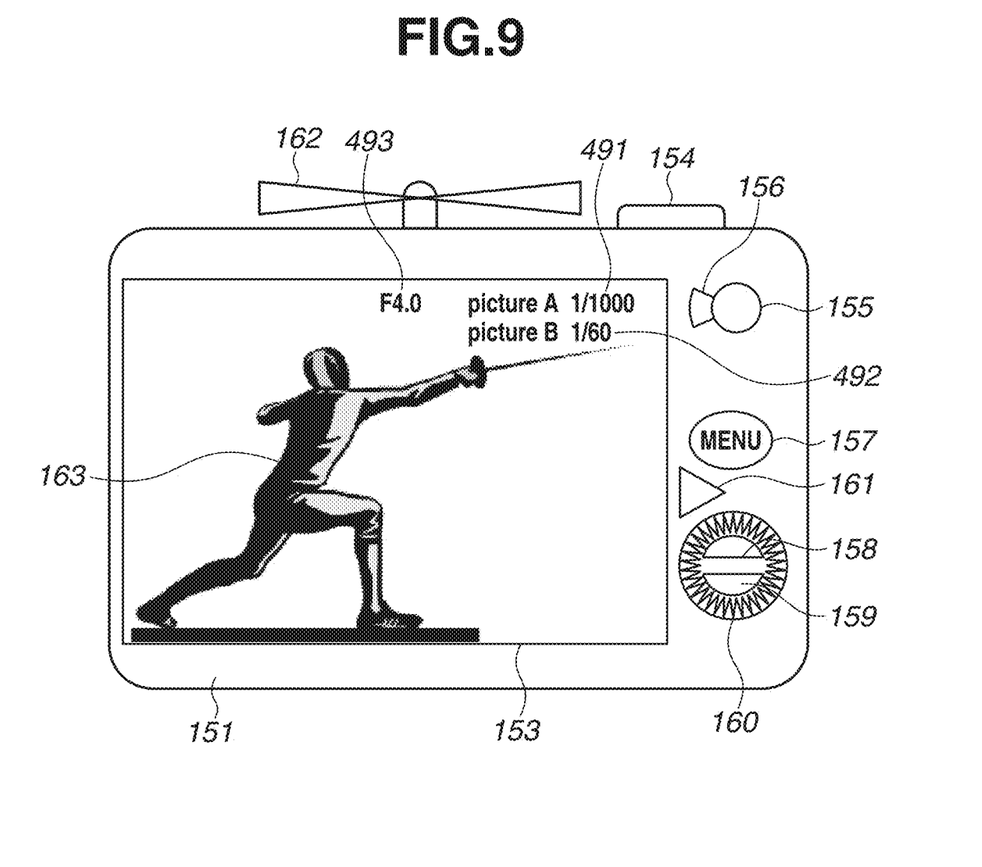
FIG. 9 is a diagram illustrating a display unit which is in the process of live view displaying.

FIG. 9 is a diagram illustrating a behavior of the display unit 153, which is displaying a live view after the imaging apparatus is powered on. A sports scene of a person 163 captured via the imaging optical system 152 is being displayed on the display unit 153. Moreover, since the selection lever 156 is in a position rotated clockwise, the shutter speed 491 for a still image (picture A), the shutter speed 492 for a moving image (picture B), and the F-number 493 in the dual video mode are being displayed.

Figure 10:
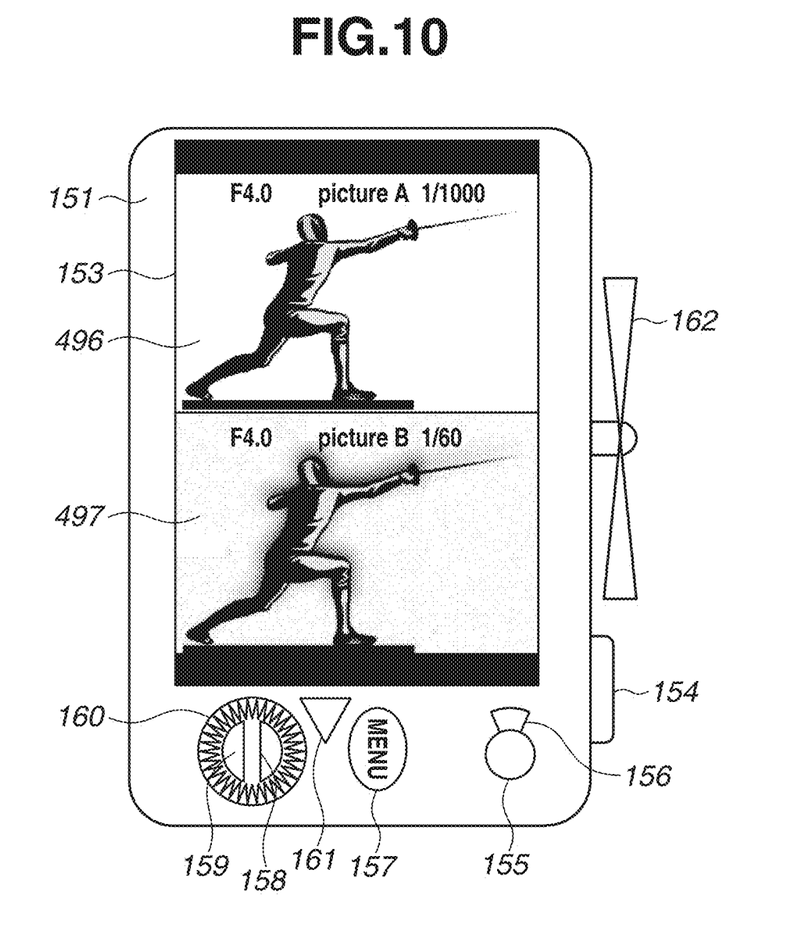
FIG. 10 is a diagram illustrating a state in which both a still image and a moving image are displayed side by side on the display unit.

FIG. 10 is a diagram illustrating a state in which both a still image and a moving image are displayed side by side in the vertical direction on the display unit 153. When the playback button 161 is operated, both a still image 496 and a moving image 497 are displayed side by side on the display unit 153, so that the user can confirm the level of a stop motion effect by comparing the still image 496 and the moving image 497 with each other. Furthermore, processing for displaying both a still image and a moving image side by side can be performed by the imaging apparatus 10, or can be performed by an external system or apparatus to which video data is supplied from the imaging apparatus 10 via a network.

Figure 11:
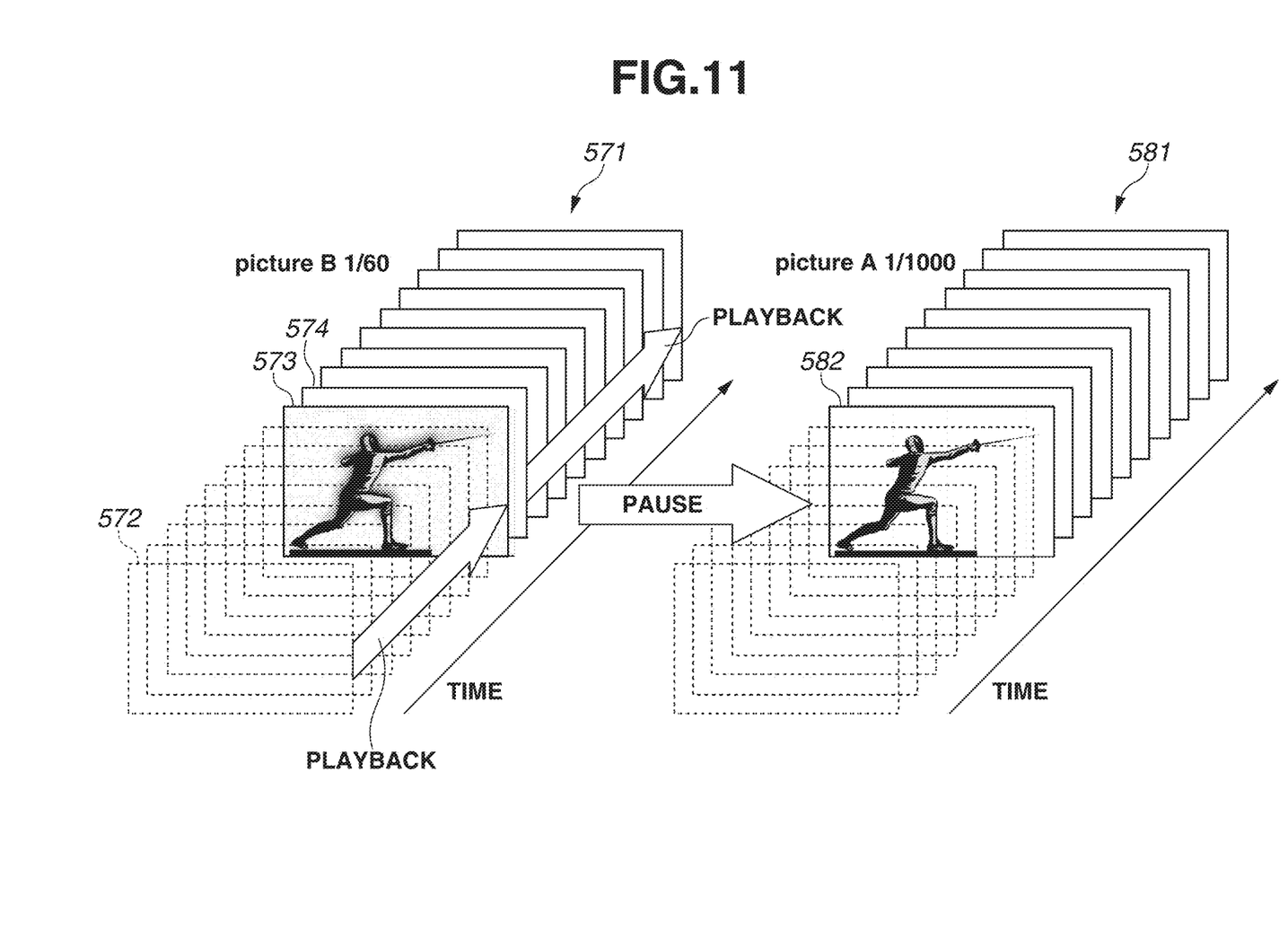
FIG. 11 is a diagram used to describe an example of utilization of a still image and a moving image.

FIG. 11 is a diagram illustrating an example of utilization of a still image (picture A) and a moving image (picture B) displayed on, for example, a tablet terminal, a personal computer, or a television monitor. Data files of the still image (picture A) and the moving image (picture B) are stored in, for example, a storage on a network. In FIG. 11, a frame group 581 is a group of frames of the still image (picture A) stored in an MP4 file. A frame group 571 is a group of frames of the moving image (picture B) stored in an MP4 file different from the MP4 file in which the frame group 581 is stored. An MP4 file storing a still image or a moving image has the same CLIP UMID set at the time of image capturing and is subjected to association therewith.

When playback of a moving image is started on, for example, a tablet terminal, frames starting with a leading frame 572 of the frame group 571 of the moving image (picture B) are sequentially played back at a predetermined frame rate. If the shutter speed is set excessively fast, a moving image (picture B) would become a video image with a riffling feeling. In the present exemplary embodiment, since the shutter speed is set to $1/60$ seconds in such a way as to prevent the shutter speed from becoming excessively fast, the played-back image becomes a high-quality video image with a fluid motion and without a riffling feeling in a frame-by-frame playback manner.

When the user performs a pause operation at a point of time when playback has advanced to a frame 573, a frame 582 having the same time code as that of the frame 573 is automatically retrieved from a data file of the still image (picture A) corresponding to the moving image (picture B) and is then displayed. The still image (picture A) is an image captured at a high shutter speed of, for example, $1/1000$ seconds facilitating obtaining a stop motion effect and is an exciting image obtained by capturing the stopped image of the instant of a sports scene.

In a case where the pause operation is performed to issue an instruction for printing, data of the frame 582 of the still image (picture A) is output to the printer 195 via the print I/F 194. Accordingly, the thus-obtained printed product is also an exciting one with a stop motion effect. When the user cancels the pause operation, playback automatically returns to the frame group 571 of the moving image (picture B) and starts again with a frame 574.

In the present exemplary embodiment, two video images, i.e., a still image (picture A) and a moving image (picture B), are captured with settings of different accumulation periods (shutter speeds). While the two video images are captured with different accumulation periods, gain-up is not performed on the still image (picture A), and nearly equal signal charges are obtained in the image sensor, so that both of the two video images are a video image excellent in S/N ratio and giving no noise feeling.

As described above, according to the present exemplary embodiment, in a case where the single image sensor 184 is used to almost concurrently capture two video images, a moving image and a still image, with exclusive accumulation control operations, acquiring a high-quality moving image and still image according to an exposure time of the still image is enabled.

Some embodiments can also be implemented by supplying a program for implementing one or more functions of the above-described exemplary embodiment to a system or apparatus via a network or a storage medium and causing one or more processors of a computer of the system or apparatus to read and execute the program. Moreover, some embodiments can also be implemented by a circuit which implements one or more of the functions (for example, an application specific integrated circuit (ASIC)).

While exemplary embodiments have been described above, the claims are not limited to these exemplary embodiments, but can be modified and altered in various manners within the scope thereof.

Other Embodiments

Some embodiment(s) can also be realized by a computer of a system or apparatus that reads out and executes computer-executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer-executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer-executable instructions. The computer-executable instructions may be provided to the computer, for example, from a network or the storage medium. The storage medium may include, for example, one or more of a hard disk, a random access memory (RAM), a read-only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has described exemplary embodiments, it is to be understood that the claims are not limited to the disclosed exemplary embodiments. The scope of the following claims is to be accorded the broadest interpretation so as to encompass all such modifications and equivalent structures and functions.

This application claims priority to Japanese Patent Application No. 2017-160119 filed Aug. 23, 2017, which is hereby incorporated by reference herein in its entirety.

What is claimed is:

1. An imaging apparatus comprising:
an imaging unit configured to acquire both a first image and a second image in one image capturing period, wherein the second image is acquired by performing multiple accumulations of signal charges in the one image capturing period, wherein the multiple accumulations do not overlap each other in the one image capturing period, and wherein the first image is acquired by performing an accumulation of signal charges for an accumulation period in the one image capturing period; and
a control unit configured to control accumulation of signal charges by the imaging unit,
wherein the control unit determines a number of the multiple accumulations of signal charges, in the one image capturing period, for acquiring the second image based on the accumulation period, in the one image capturing period, of the accumulation of signal charges for acquiring the first image.

2. The imaging apparatus according to claim 1, wherein the control unit increases the number of the multiple accumulations in a case where the accumulation period of the accumulation of signal charges for acquiring the first image is short, and decreases the number of the multiple accumulations in a case where the accumulation period of the accumulation of signal charges for acquiring the first image is long.

3. The imaging apparatus according to claim 1,
wherein the imaging unit includes an image sensor in which a plurality of pixel portions is two-dimensionally arrayed, and
wherein each of the plurality of pixel portions includes a photoelectric conversion portion, a first signal retention portion configured to perform the accumulation of signal charges for acquiring the first image, and a second signal retention portion configured to perform the multiple accumulations of signal charges for acquiring the second image.

4. The imaging apparatus according to claim 3,
wherein, during the one image capturing period, the first signal retention portion accumulates, at least once, signal charges generated at the photoelectric conversion portion, and
wherein, during the one image capturing period, the second signal retention portion performs the multiple accumulations of signal charges generated at the photoelectric conversion portion.

5. The imaging apparatus according to claim 1, wherein the control unit sets an upper limit and a lower limit to the accumulation period of signal charges for acquiring the first image, and sets an upper limit and a lower limit to the number of accumulations of signal charges in the one image capturing period.

6. The imaging apparatus according to claim 1, wherein the control unit causes the multiple accumulations of signal charges for acquiring the second image to be performed at equal intervals, and causes the accumulation of signal charges for acquiring the first image to be performed between two of the multiple accumulations of signal charges for acquiring the second image.

7. The imaging apparatus according to claim 1, wherein the control unit causes the accumulation of signal charges for acquiring the first image and a readout of the accumulated signal charges for acquiring the first image to be performed near a middle of the one image capturing period.

8. The imaging apparatus according to claim 1, wherein the control unit causes a readout of signal charges accumulated for acquiring the second image to be performed after all accumulations in the one image capturing period end and before any accumulation in a next image capturing period starts.

9. The imaging apparatus according to claim 1, wherein the control unit controls the number of the multiple accumulations and respective periods of time of the multiple accumulations in such a manner that a total of the respective periods of time of the multiple accumulations of signal charges for acquiring the second image in the one image capturing period is equal to the accumulation period of the accumulation of signal charges for acquiring the first image.

10. The imaging apparatus according to claim 1, wherein the first image is a still image, and the second image is a moving image.

11. The imaging apparatus according to claim 1, wherein, in the one image capturing period, none of the multiple accumulations of signal charges for generating the second image overlap the accumulation of signal charges for generating the first image.

12. The imaging apparatus according to claim 1, wherein the control unit is further configured to control the accumulation of signal charges such that, in the one imaging capturing period, at least two of the multiple accumulations of signal charges are performed before the accumulation period of the accumulation of signal charges for generating the first image.

13. The imaging apparatus according to claim 12, wherein the control unit is further configured to control the accumulation of signal charges such that, in the one imaging capturing period, at least two of the multiple accumulations of signal charges are performed after the accumulation period of the accumulation of signal charges for generating the first image.

14. The imaging apparatus according to claim 1, wherein the accumulated signal charges of each of the multiple accumulations of signal charges in the one image capturing period are transferred to a signal retention portion before a next accumulation of the multiple accumulations of signal charges in the one image capturing period begins.

15. The imaging apparatus according to claim 1, wherein the multiple accumulations of signal charges for acquiring the second image are evenly distributed throughout the one image capturing period.

16. A control method for an imaging apparatus, the control method comprising:
performing an imaging operation to generate both a first image and a second image in one image capturing period, wherein the second image is generated by performing multiple accumulations of signal charges in the one image capturing period, wherein the multiple accumulations do not overlap each other in the one image capturing period, and wherein the first image is generated by performing an accumulation of signal charges for an accumulation period in the one image capturing period; and
performing a control operation to control accumulation of signal charges by the imaging operation,
wherein the control operation determines a number of the multiple accumulations of signal charges, in the one image capturing period, for generating the second image based on the accumulation period, in the one image capturing period, of the accumulation of signal charges for generating the first image.

17. An imaging apparatus comprising:
an imaging unit configured to generate both a first image and a second image in one image capturing period, wherein the first image is generated by performing an accumulation of signal charges for an accumulation period in the one image capturing period, wherein the second image is generated by performing a plurality of discrete accumulations of signal charges in the one image capturing period, and wherein the plurality of discrete accumulations each have a respective accumulation period in the one image capturing period; and
a control unit configured to control accumulations of signal charges by the imaging unit, wherein the control unit determines a number of the plurality of discrete accumulations of signal charges, in the one image capturing period, for generating the second image based on the accumulation period, in the one image capturing period, of the accumulation of signal charges for generating the first image.

18. The imaging apparatus according to claim 17, wherein an aggregate of the respective accumulation periods of the plurality of discrete accumulations equals the accumulation period for the accumulation of signal charges for acquiring the first image.

19. The imaging apparatus according to claim 17, wherein the plurality of discrete accumulations of signal charges are separated from each other, in the one image capturing period, by a same amount of time.

* * * * *